(12) United States Patent
Lee et al.

(10) Patent No.: US 6,486,047 B2
(45) Date of Patent: Nov. 26, 2002

(54) APPARATUS FOR FORMING STRONTIUM-TANTALUM-OXIDE THIN FILM

(75) Inventors: Won-Jae Lee, Taejon (KR); In-Kyu You, Taejon (KR); Yil-Suk Yang, Taejon (KR); Byoung-Gon Yu, Taejon (KR); Kyoung-Ik Cho, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/872,279

(22) Filed: May 31, 2001

(65) Prior Publication Data

US 2002/0064927 A1 May 30, 2002

(30) Foreign Application Priority Data

Nov. 30, 2000 (KR) .............................................. 00-72033

(51) Int. Cl.[7] ......................... H01L 21/26; H01L 21/42
(52) U.S. Cl. .............................. 438/513; 438/905
(58) Field of Search ........................ 438/513, 680, 438/715, 758, 785, 778, 905

(56) References Cited

U.S. PATENT DOCUMENTS

| | | | | |
|---|---|---|---|---|
| 4,058,430 A | | 11/1977 | Suntola et al. ............... 156/611 |
| 5,426,075 A | * | 6/1995 | Perino et al. ................ 438/513 |
| 5,519,566 A | * | 5/1996 | Perino et al. ............. 361/321.4 |
| 5,888,583 A | * | 3/1999 | McMillan et al. ............. 427/96 |
| 6,042,652 A | | 3/2000 | Hyun et al. .................. 118/719 |
| 6,110,531 A | * | 8/2000 | Paz de Araujo et al. ...................... 427/255.25 |
| 6,120,846 A | * | 9/2000 | Hintermaier et al. ........ 427/269 |

* cited by examiner

Primary Examiner—David Nelms
Assistant Examiner—David Nhu
(74) Attorney, Agent, or Firm—Seed Intellectual Property Law Group PLLC

(57) ABSTRACT

An apparatus for forming Strontium-Tantalum-Oxide films and a method thereof using an atomic layer deposition tool are provided. In the Strontium-Tantalum-Oxide films deposited by using plasma and the atomic layer deposition, its leakage-current is very low, and its dielectric constant has a range of 30 to 100 depending on the there heating conditions. Therefore, the method provides structures for i) an insulating film of an NDRO-type ferroelectric memory device that has a structure of Metal-film/Ferroelectric-film/Insulating-film/Silicon, ii) a gate oxide film substituting for silicon oxide film, and iii) an insulating film of Electro Luminescent Display (ELD) device.

6 Claims, 5 Drawing Sheets

| Source | Sr(Ta(OEt)₅)₂ dmae |
|---|---|
| Carrier Gas (sccm) | Ar (100sccm) |
| Purge Gas (sccm) | Ar (100sccm) |
| Reactant Gas (sccm) | O₂ (100sccm) |
| Processing Pressure (torr) | 0.5~1.5 torr |
| Vaporizer Temperature (°C) | 155~165°C |
| Gas line Temperature (°C) | 170°C |
| Substrate Temperature (°C) | 200~300°C |
| Substrate | Pt/Ti/SiO₂/Si |

APPARATUS FOR FORMING STRONTIUM-TANTALUM-OXIDE THIN FILM

TECHNICAL FIELD

The invention relates generally to a method for forming dielectric/insulating oxide film, and more particularly to a method for fabricating a Strontium-Tantalum-Oxide thin film.

BACKGROUND OF THE INVENTION

A structure of dielectric/insulating oxide film is used in various fields. For example, it is used in i) an insulating film of an NDRO-type ferroelectric memory device which has a structure of Metal-film/Ferroelectric-film/Insulating-film/Silicon, ii) a gate oxide film substituting for silicon oxide film, and iii) an insulating film of Electro Luminescent Display (ELD) device, and the like.

A development of ferroelectric semiconductor devices for the high-capacity memory has been actively made to overcome the refresh problem related to the conventional Dynamic Random Access Memory (DRAM), by using capacitors made of ferroelectric materials. The ferroelectric memory device is a kind of non-volatile memory device. Since it has merits of keeping the stored data under power-off state and being equivalent to the conventional DRAM in the operating speed, it is viewed as the memory device for next-generation. The ferroelectric material in a normal temperature has several hundreds to several thousand of dielectric constants, and it has states of two stable remnant polarizations. Therefore, since polarization directions of input signals are controlled toward toe directions of the applied electric field, when the applied electric field is removed, digital signals 0 and 1 are stored on the basis of directions of the remaining remanent polarization.

Until now, dielectric-films in ferroelectric capacitors generally use PZT ($Pb(Zr_xTi_{1-x})O_3$), SBT ($Sr_xBi_yTa_2O_9$), and the like. The important features of each material are as follows: the PZT has merits that its ferroelectric characteristics are excellent, and it allows a low-temperature process essentially needed for fabricating high-density devices. Meanwhile, due to the fatigue phenomenon, it has demerits that the specific oxide electrode should be used, and the leakage-current is large. Contrary to the PZT, since the SBT shows no fatigue phenomenon, and has distinguished characteristics on metal electrode, developments of the SBT have been actively made.

Also, intermediate insulting-films used in the ferroelectric memory device must have the important features as follows: high dielectric constant, low leakage-current, and no reaction with the ferroelectric insulating-films and silicon surfaces. In addition, gate oxide films substituting for silicon oxide films, and insulating-films of Electro Luminescent Display (ELD) device require the high dielectric constant and the low leakage-current as well.

SUMMARY OF THE INVENTION

The present invention overcomes the above conventional problems and provides a method for forming, at low temperature, Strontium-Tantalum-Oxide film with a comparative high dielectric-constant and a comparative low leakage-current.

In order to accomplish the above, according to the present invention, a method is provided for forming Strontium-Tantalum-Oxide thin film on a patterned substrate comprising the steps of:

a) arranging said substrate in a reaction chamber;
b) introducing a source material into the reaction chamber using a carrier gas, said source material being vaporized in said carrier gas and containing Strontium Tantalum Ethoxide;
c) blowing said source material out of said reaction chamber using purge gas;
d) introducing oxygen gas into the reaction chamber and generating oxygen plasma; and
e) blowing the oxygen plasma out of the reaction chamber using purge gas.

Further, according to the present invention, an apparatus for forming Strontium-Tantalum-Oxide thin film on a patterned substrate comprising:

a) a reaction chamber for accommodating said substrate;
b) a source supplying unit for supplying a source material to the reaction chamber using a carrier gas, said source material being vaporized in said carrier gas and containing Strontium Tantalum Ethoxide;
c) an oxygen supplying unit for introducing oxygen gas into the reaction chamber;
d) a plasma generating unit for generating oxygen plasma in the reaction chamber; and
e) a purge gas injecting unit for injecting purge gas into the reaction chamber.

The present invention provide a method for forming Strontium-Tantalum-Oxide (Sr—Ta—O) thin films, and it provides a structure of device using the formed thin films. The present invention forms the Strontium-Tantalum-Oxide films using an atomic layer deposition, and embodies structures for i) an insulating film of an NDRO-type ferroelectric memory device that has a structure of Metal-film/Ferroelectric-film/Insulating-film/Silicon, ii) a gate oxide film substituting for a silicon oxide film, and iii) an insulating film of Electro Luminescent Display (ELD) device. In the Strontium-Tantalum-Oxide films, a composition ratio of Sr/Ta is within a range of 0.45 to 0.60.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1:
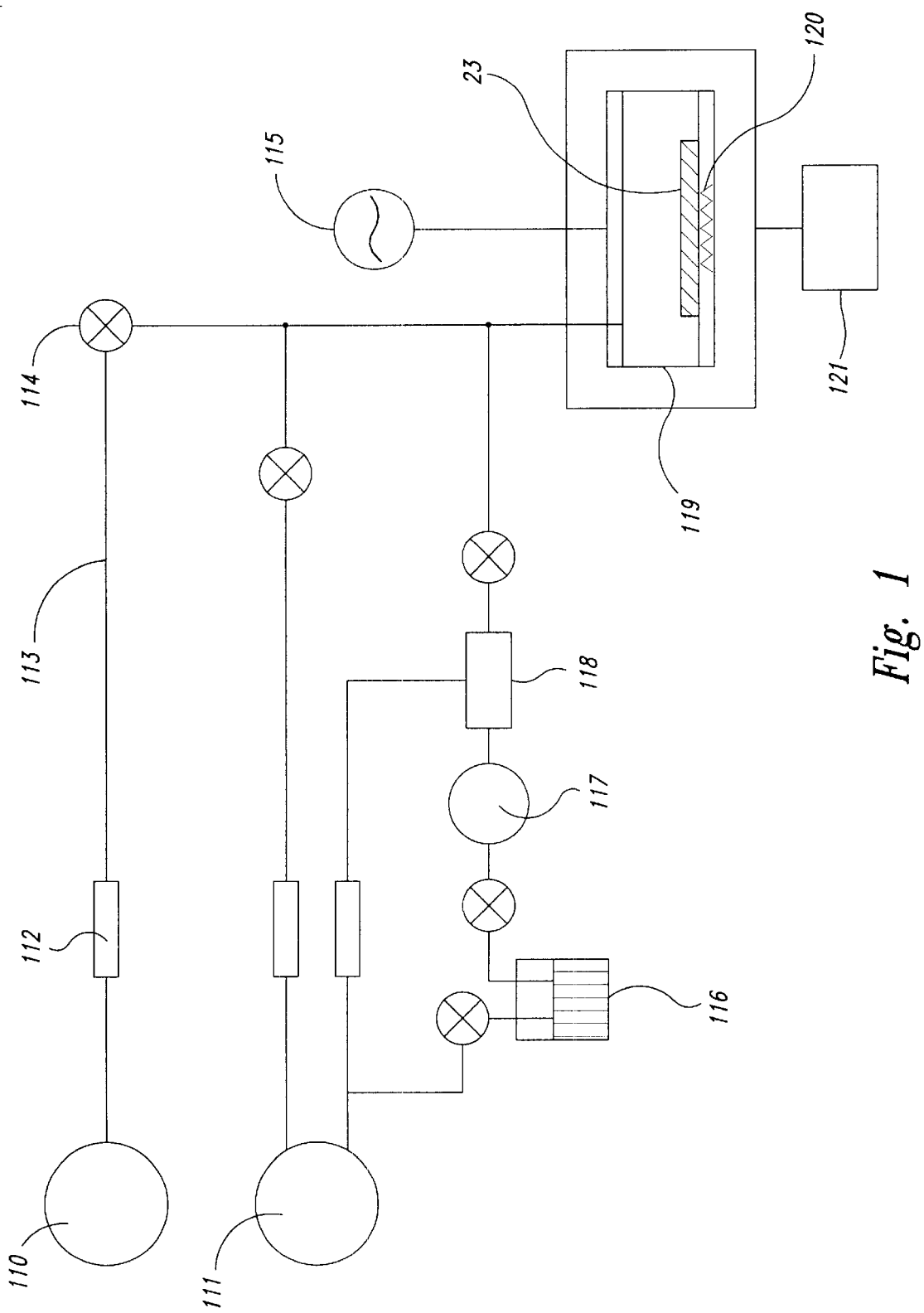
FIG. 1 illustrates the equipment for forming Strontium-Tantalum-Oxide films according to an embodiment of the present invention.

The present invention will be described in detail by way of a preferred embodiment with reference to accompanying drawings, in which like reference numerals are used to identify the same or similar parts.

FIG. 1 illustrates the equipment for forming Strontium-Tantalum-Oxide films according to an embodiment of the present invention, and will be explained as follows.

Referring to FIG. 1, the equipment has a source transfer part comprising a source reservoir 116 for storing Sr—Ta source (Strontium-Tantalum Ethoxide), a micropump 117 for controlling the source, and a vaporizer 118. Also, it has a plasma generator 115 for generating plasma, a reaction chamber 119 with a substrate to be heated by a heater 120. First, argon gas 111 and reactant oxygen-gas 110 are inpoured into the reaction chamber 119 under the control of a mass flow controller 112 and a valve 114. A line 113 supplies the oxygen gas to the valve 114. The Sr—Ta source in the source reservoir 116 is transferred to the micropump 117 by the pressure of the argon gas 111, and then liquid source controlled by the micropump 117 remains at a temperature within a range of 160° C. to 180° C. And then vaporized source is inpoured into the reaction chamber 119, and then the source is deposited on a substrate 23. An exhaust pump 121 exhausts source material, oxygen plasma, and argon gas from the reaction chamber 119.

Figure 2:
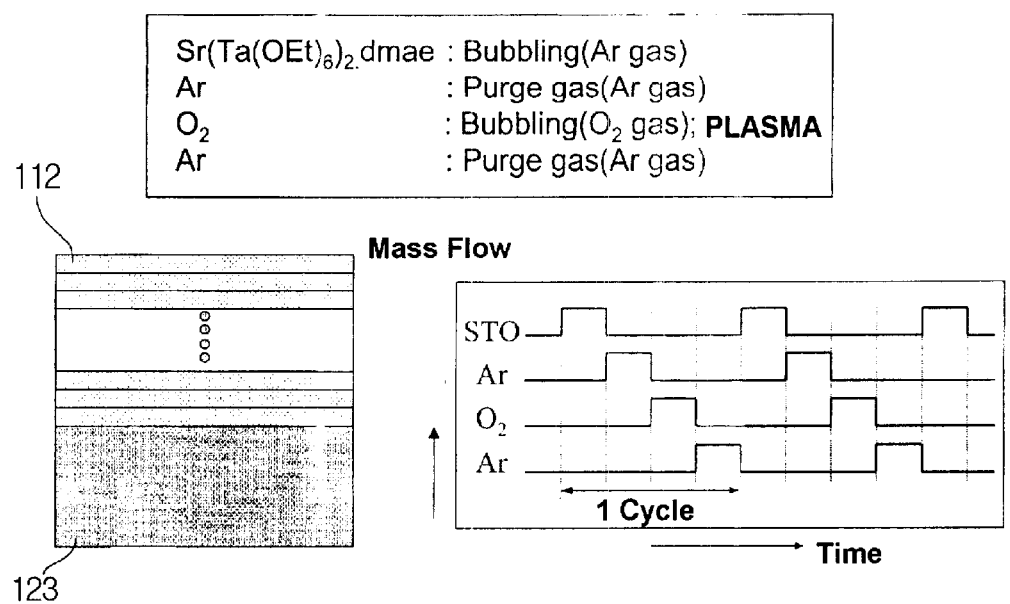
FIG. 2 illustrates schematically a method for forming Strontium-Tantalum-Oxide films and a chart of mass flow according to an embodiment of the present invention.

FIG. 2 schematically illustrates a method for forming Strontium-Tantalum-Oxide films and a chart of mass flow according to an embodiment of the present invention, and will be explained below.

Firstly, when Sr—Ta source is inpoured into the reaction chamber, Sr—Ta film is deposited on the substrate in the reaction chamber. Then, Argon gas acting as purge gas is inpoured to make the deposited Sr—Ta film more uniform and to form only a single Sr—Ta film.

Next, by inpouring the reactant oxygen-gas into the reaction chamber in order to form Strontium-Tantalum-Oxide structure, and by generating plasma the Sr—Ta source deposited on the substrate is changed to Sr—Ta—O film. And, the argon gas acting as purge gas is re-transferred into the reaction chamber not to generate a deposition reaction by removing the reactant gas from the reaction chamber. By reiterating the cycle of the above-mentioned steps, Sr—Ta—O thin films are deposited one layer after another. The plasma is generated at the portions where the reactant gas is inpoured for several reasons: for example, when the source is deposited by generating the plasma, a temperature of the substrate for forming the deposition layer may be lowered, and the formed films has no impurities of carbon, and the like. Some problems may occur since the temperature of the substrate capable of using the atomic layer deposition is generally low, but they may be solved by the above-mentioned method.

Meanwhile, when the experiment in an embodiment of the present invention was performed by changing the composition ratio of Sr/Ta within a range of 0.45 to 0.60, and the result was excellent. In addition, the temperature in the reaction chamber was within a range of 200° C. to 300° C., and the pressure was within a range of 0.5 Torr to 1.5 Torr.

Figures 3, 4:
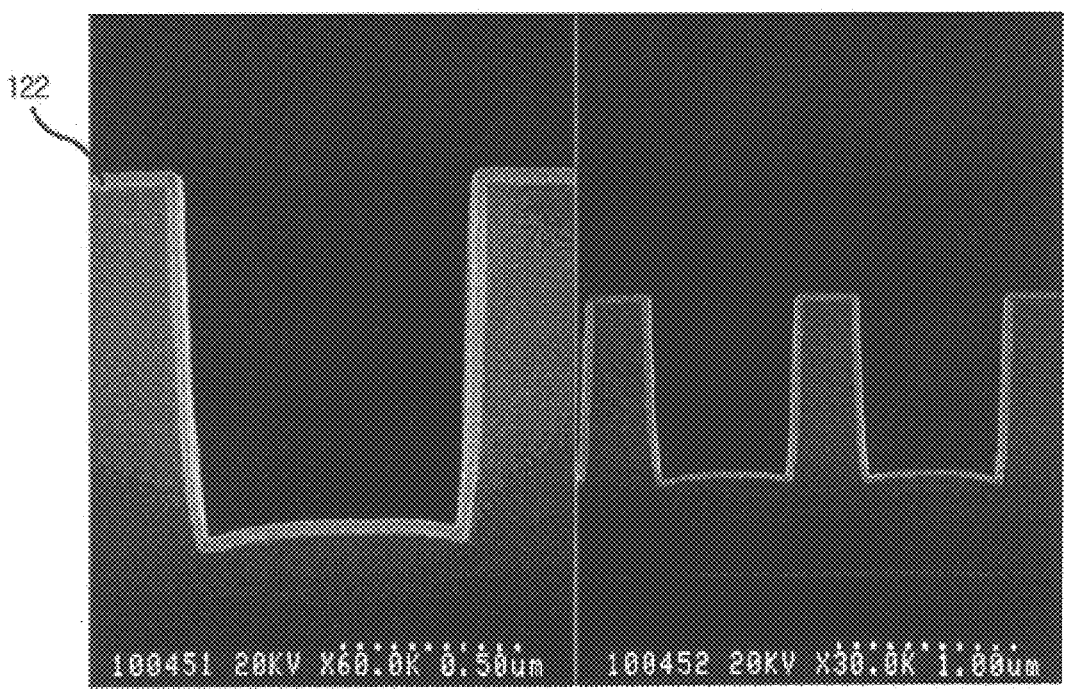
FIG. 3 is a table of deposition variables for forming Strontium-Tantalum-Oxide films according to an embodiment of the present invention.
FIG. 4 is a photograph of the Strontium-Tantalum-Oxide film deposited on a patterned silicon substrate according to an embodiment of the present invention.

FIG. 3 is a table of deposition variables for forming Strontium-Tantalum-Oxide films according to an embodiment of the present invention, and illustrates the amount of gas and processing pressure, and the like.

The temperature of vaporizer was fixed within a range about 155° C. to 165° C., and a temperature of gas line remained within a range of 160° C. to 180° C. The temperature of the substrate was fixed within a range of 200° C. to 300° C. that is capable of applying the atomic layer deposition.

FIG. 4 is a photograph of the Strontium-Tantalum-Oxide film deposited on a patterned silicon substrate according to an embodiment of the present invention, and illustrates the result that Sr—Ta—O thin films formed by the above-mentioned method.

The substrate is patterned by forming a silicon Oxide film on silicon. As shown in FIG. 4, the Sr—Ta—O thin film was deposited uniformly. It shows a distinguished feature of almost 100% step coverage.

Figure 5:
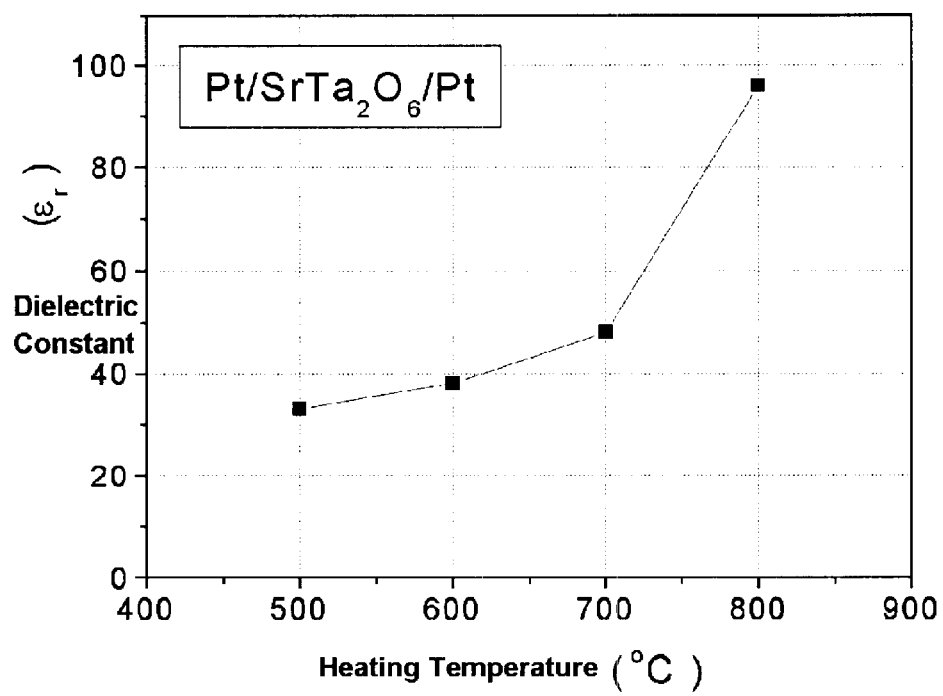
FIG. 5 is a graph for illustrating electric constant features regarding to heating conditions for forming a Strontium-Tantalum-Oxide thin film according to an embodiment of the present invention.
Figure 6:
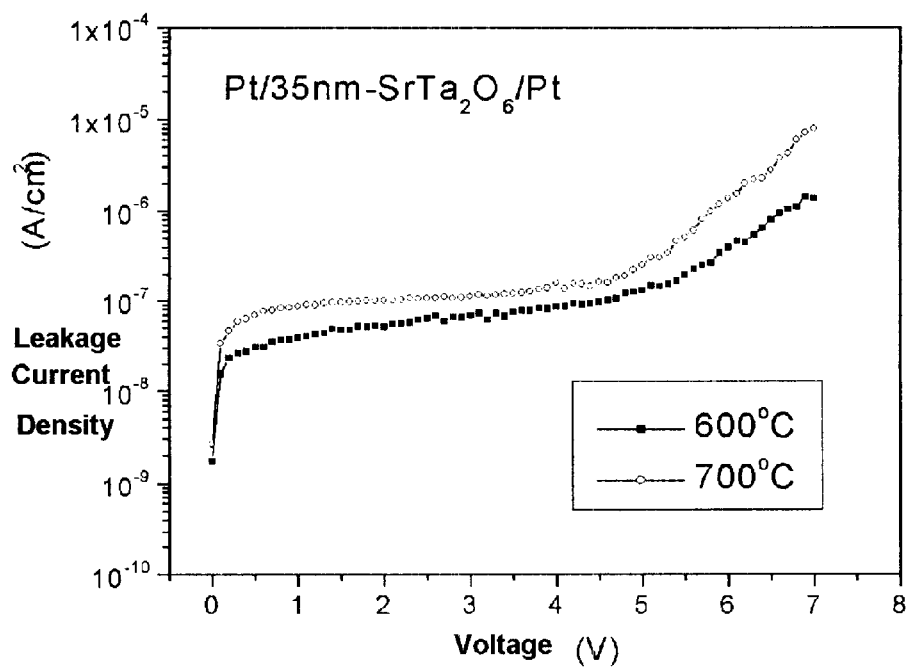
FIG. 6 is a graph for illustrating leakage current features regarding to heating conditions for forming a Strontium-Tantalum-Oxide thin film according to an embodiment of the present invention.

FIG. 5 is a graph for illustrating the dielectric constant characteristic according to the heating condition for forming a Strontium-Tantalum-Oxide thin film. And FIG. 6 is a graph for illustrating the leakage current characteristic according to the heating condition for forming a Strontium-Tantalum-Oxide thin film. This will be explained below.

FIG. 5 illustrates that the dielectric constant changes within a range of 30 to 100 when the heating temperature is changed within a range of 500° C. to 800° C., and also as shown in FIG. 6, the leakage-current shows excellent characteristic in a sample treated with the heating temperature changed within a range of 600° C. to 700° C.

Figure 7:
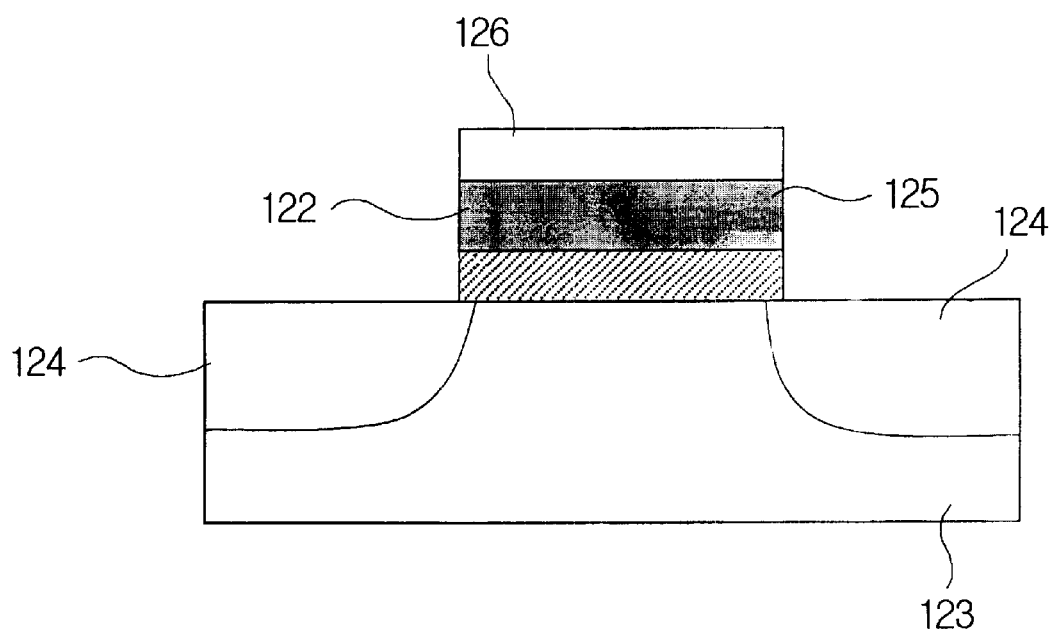
FIG. 7 illustrates schematically a lateral cross-sectional view of memory device according to an embodiment of the present invention.

FIG. 7 schematically illustrates a lateral cross-sectional view of memory device according to an embodiment of the present invention, and illustrates an example using the Strontium-Tantalum-Oxide film fabricated according to the present invention.

FIG. 7 illustrates a schematic cross-sectional view of the ferroelectric memory device comprising a Sr—Ta—O thin film 122 formed on the silicon substrate 123, a ferroelectric film 125 formed on the Sr—Ta—O thin films 122, and a top electrode 126. Also, if the ferroelectric film is not deposited, this device has a transistor structure (top electrode 126/Sr—Ta—O film 122/silicon substrate 123), and the Sr—Ta—O thin film acts as gate oxide structure substituting for the conventional silicon oxide film.

Therefore, since the present invention forms Strontium-Tantalum-Oxide film with relatively high dielectric constant and with relative low leakage current, by using plasma and the atomic layer deposition technique, it may improve the electric characteristics of ferroelectric memory device, transistor, and the like. In addition, by utilizing plasma, the present invention solves the problems of the atomic layer deposition such as impurity addition since it may use a lower temperature compared to conventional Chemical Vapor Deposition(CVD).

The present invention has been described with reference to a particular embodiment in connection with a particular application. Those having ordinary skill in the art and access to the teachings of the present invention will recognize additional modifications and applications within the scope thereof.

It is therefore intended by the appended claims and the equivalents thereof to cover any and all such applications, modifications, and embodiments within the scope of the present invention.

What is claimed:

1. A method for forming Strontium-Tantalum-Oxide thin film on a patterned substrate, comprising the steps of:

a) arranging said substrate in a reaction chamber;
b) introducing a source material into the reaction chamber using a carrier gas, said source material being vaporized in said carrier gas and containing Strontium Tantalum Ethoxide;
c) blowing said source material out of said reaction chamber using purge gas;
d) introducing oxygen gas into the reaction chamber and generating oxygen plasma; and
e) blowing the oxygen plasma out of the reaction chamber using purge gas.

2. The method according to claim 1, wherein the substrate of step a) is heated at a temperature within a range of 200° C. to 300° C.

3. The method according to claim 1, wherein the source material of step b) is vaporized at a temperature within a range of 155° C. to 165° C.

4. The method according to claim 1, wherein the composition ratio of Sr/Ta of the source material is within a range of 0.45 to 0.60.

5. The method according to claim 1, wherein the pressure in the reaction chamber is within a range of 0.5 Torr to 1.5 Torr.

6. The method according to claim 1, the steps of a) to e) are reiterated in order to form a plurality of the Strontium-Tantalum-Oxide films.

* * * * *